(12) United States Patent
Anderson et al.

(10) Patent No.: US 8,138,072 B2
(45) Date of Patent: Mar. 20, 2012

(54) SEMICONDUCTOR STRUCTURES AND METHODS OF MANUFACTURE

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 232 days.

(21) Appl. No.: 12/500,022

(22) Filed: Jul. 9, 2009

(65) Prior Publication Data

US 2011/0006359 A1    Jan. 13, 2011

(51) Int. Cl.
*H01L 21/22* (2006.01)
(52) U.S. Cl. .................. 438/558; 257/E21.468
(58) Field of Classification Search .......... 438/510, 438/522, 558, 923; 257/E21.144, E21.468
See application file for complete search history.

(56) References Cited

U.S. PATENT DOCUMENTS

| 4,714,519 A | 12/1987 | Pfiester |
| 5,264,380 A | 11/1993 | Pfiester |
| 6,509,233 B2 | 1/2003 | Chang et al. |
| 6,586,808 B1 | 7/2003 | Xiang et al. |
| 6,900,098 B1 | 5/2005 | Ogura et al. |
| 7,374,998 B2 | 5/2008 | Hergenrother et al. |
| 2003/0141525 A1 | 7/2003 | Nowak |
| 2010/0197128 A1* | 8/2010 | Schaeffer et al. ............. 438/591 |

FOREIGN PATENT DOCUMENTS

JP    2252264    10/1990

OTHER PUBLICATIONS

Bin Yu et al. "Short-Channel Effect Improved by Lateral Channel-Engineering in Deep-Submicronmeter MOSFET's", IEEE Transactions on Electron Devices, vol. 44, No. 4, Apr. 1997, pp. 627-634.

* cited by examiner

*Primary Examiner* — Quoc Hoang
(74) *Attorney, Agent, or Firm* — Richard Kotulak; Roberts Mlotkowski Safran & Cole, P.C.

(57) ABSTRACT

Semiconductor structures and methods of manufacture semiconductors are provided which relate to transistors. The method of forming a transistor includes thermally annealing a selectively patterned dopant material formed on a high-k dielectric material to form a high charge density dielectric layer from the high-k dielectric material. The high charge density dielectric layer is formed with thermal annealing-induced electric dipoles at locations corresponding to the selectively patterned dopant material.

20 Claims, 6 Drawing Sheets

US 8,138,072 B2

SEMICONDUCTOR STRUCTURES AND METHODS OF MANUFACTURE

FIELD OF THE INVENTION

The invention relates to semiconductor structures and methods of manufacture and, more particularly, to high-k modified short channel effect structures and methods of manufacture.

BACKGROUND

Field effect transistors (FETs) are a type of transistor that relies on an electric field to control the conductivity of a channel of one type of charge carrier in a semiconductor material. FETs are sometimes called unipolar transistors to contrast their single-carrier-type operation with the dual-carrier-type operation of bipolar (junction) transistors (BJT).

Attempts to scale FETS (e.g., to the 45 nm to 28 nm nodes) are pushing the boundaries of current technology, resulting in diminishing returns. For example, as the FET is scaled, many limitations have been discovered. Specifically, it has been found that as the channel length L decreases, there is a considerable problem with a diminishing $V_T$. This impairs device performance and makes it difficult to design integrated circuits with short channel lengths. It has also been found that attempts to further scale the FET (e.g., 45 nm to 28 nm nodes) has resulted in scattering and reduced electron mobility (short channel effects). This is due to a charge entering the substrate from an overlying dielectric layer.

Accordingly, there exists a need in the art to overcome the deficiencies and limitations described hereinabove.

SUMMARY

In a first aspect of the invention, a method of forming a transistor comprises thermally annealing a selectively patterned dopant material formed on a high-k dielectric material to form a high charge density dielectric layer. The high charge density dielectric layer is formed with thermal annealing-induced electric dipoles at locations corresponding to the selectively patterned dopant material.

In another aspect of the invention, a method comprises: forming a lower dielectric layer on a substrate; forming an upper dielectric layer on the lower dielectric layer; depositing a dopant material above the upper dielectric layer; selectively patterning the dopant material; and thermally annealing the dopant material to form a high charge density dielectric layer with electric dipoles. The electric dipoles are separated from the substrate by the lower dielectric material.

In yet another aspect of the invention, a structure comprises a high charge density dielectric layer formed from a high-k dielectric material doped with a metal dopant layer. The high charge density layer has thermal annealing-induced electric dipoles at locations corresponding to patterned dopant material.

In another aspect of the invention, there is a design structure tangibly embodied in a machine readable medium used for designing, manufacturing, or testing an integrated circuit. The design structure includes the method steps and/or structure of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to high-k modified short channel effect structures and methods of manufacture. In embodiments, the present invention includes a high charge density dielectric placed on a portion of gate dielectric to modify short-channel Vt behavior in a FET. In particular, the high charge density dielectric has an electric dipole induced by thermal annealing, and can have a charge corresponding to edges or the center of the device form a symmetrical nFET or pFET. In other embodiments, the high charge density dielectric can have a charge formed substantially over a channel region adjacent to a source or drain region of the device to form an asymmetrical nFET or pFET. In the embodiments of the invention, the charge of the high charge density dielectric is spaced away from the underlying substrate in order to prevent deleterious transport effects, i.e., scattering and reduced electron mobility known to occur in conventional devices.

Additionally, the high charge density dielectric can be formed by thermal annealing processes to create thermal annealing-induced electric dipoles in the high charge density dielectric layer to increase performance for either a pFET or nFET, depending on the placement of the charge. For example, a positive charge adjacent to the drain region of the device will attract the electrons for an nFET, thereby enhancing transport in the channel region nearby the drain; whereas, a positive charge near the source region will benefit a pFET. Likewise, a negative charge at the drain region of the device will benefit a pFET; whereas, a negative charge near the source region will benefit a nFET.

Figure 1:
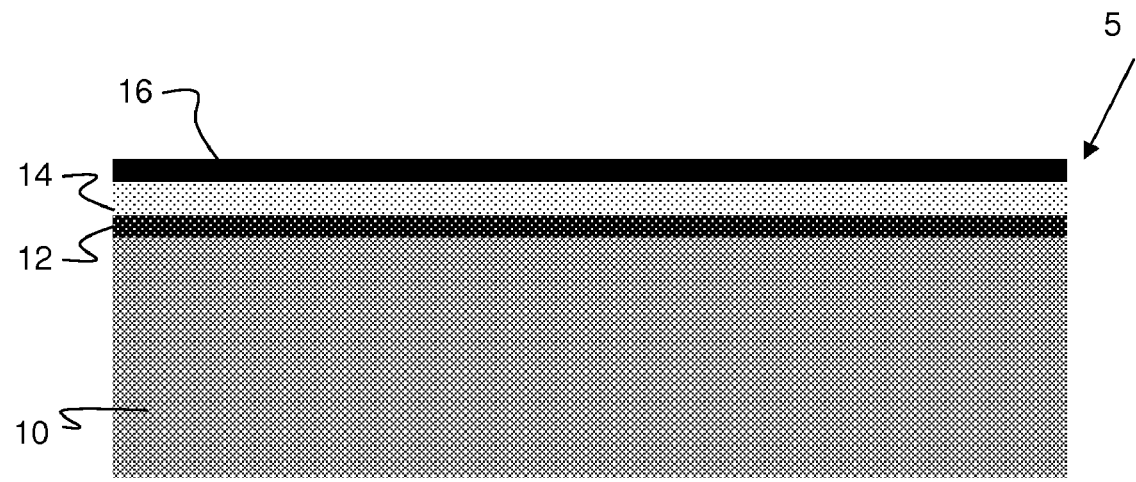
FIGS. 1-3 show structures and respective processes for a symmetrical pFET in accordance with aspects of the invention.

FIG. 1 shows a starting structure and respective processing steps to form a symmetrical field effect transistor (FET) in accordance with an aspect of the invention. The structure 5 includes a substrate 10, which can be made from any conventional substrate material such as, for example, Si, SiGe, GaAs, SOI, SiC, etc. In a two step deposition process, a lower dielectric layer 12 and an upper dielectric layer 14 are separately deposited on the substrate 10. In embodiments, the deposition processes can be, for example, chemical vapor deposition (CVD) or atomic layer deposition (ALD) processes.

In embodiments, the lower dielectric layer 12 can be silicon dioxide or oxynitride, for example, and can be manufactured with various thicknesses depending on the particular application. For example, the lower dielectric layer 12 can range from about 5 Å to 40 Å in thickness, and more specifically in the range of about 5 Å to 30 Å and even more preferably about 5 Å to 10 Å. The upper dielectric layer 14 is a high-k dielectric material which can range in thickness from about 10 Å to about 50 Å. In embodiments, the upper dielectric layer 14 can be a hafnium based material such as, for example, $HfO_x$, $HfSiN_xO_y$ or $HfTi_xO_x$.

Still referring to FIG. 1, a metal dopant layer 16 is deposited on the upper dielectric layer 14. In embodiments, the dopant layer 16 can be, for example, a compound containing Aluminum (Al) or Lanthanum (La) such as, for example, $Al_2O_3$ or $La_2O_3$ or a metal alloy such as, for example, AlTa (hereinafter referred generally to as Al or La), depending on the particular application. For example, Al or La can either be used for the formation of an nFET or pFET in accordance with the invention. As should be understood by those of skill in the art, both Al and La can be used to form thermal annealing-induced electric dipoles in the upper dielectric layer 14, as described below.

In further embodiments, the dopant layer 16 can be deposited over a thin gate electrode, deposited on the upper dielectric layer 14. In this configuration, the thin gate electrode (which can be represented also by layer 14) is about 3 Å to 10 Å; with one embodiment contemplating a thickness of about 5 Å. The use of the thin gate electrode is discussed in more detail below.

Figure 2:
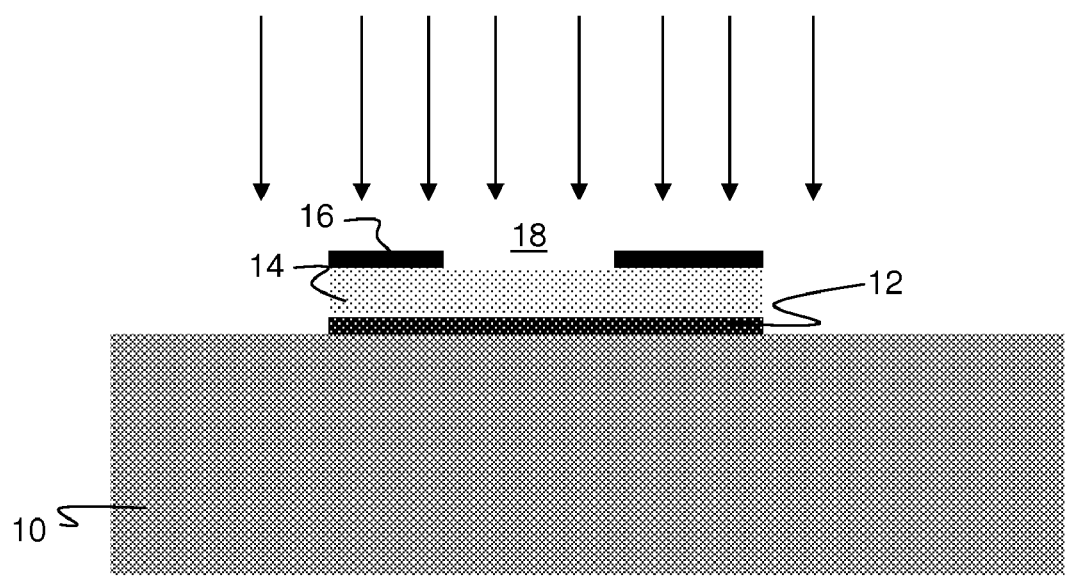

FIG. 2 shows an intermediate structure and respective processing steps in accordance with the invention. More particularly, after initial patterning of the layers, 12, 14 and 16, the dopant layer 16 is further patterned using conventional lithographic and etching processes. By way of example, a photoresist is deposited on the patterned layers, 12, 14 and 16, and selective portions of the resist are exposed to form an opening over the center of layers 12, 14 and 16. In subsequent processes, the dopant layer 16 is selectively etched to the upper dielectric layer 14 using a conventional etching process such as, for example, reactive ion etching (RIE). In the embodiment of FIG. 2, the etching creates a pattern having an opening 18 formed substantially at a center of the structure (e.g., approximately in the center of the dopant layer 16) to form a symmetrical structure. In further processing, the resist can be stripped away.

The structure of FIG. 2 undergoes a thermal annealing process, as represented by the arrows. The thermal annealing process takes place at a temperature of about 800° C. to about 1100° C., in embodiments. As should be understood by those of skill in the art, the thermal anneal of Al or La will result in thermal annealing-induced electric dipoles in the upper dielectric layer 14. In embodiments, the thermal annealing of Al results in a lower negative charge and an upper positive charge in the upper dielectric layer 14; whereas, the thermal annealing of La results in a lower positive charge and an upper negative charge in the upper dielectric layer 14.

Figure 3:
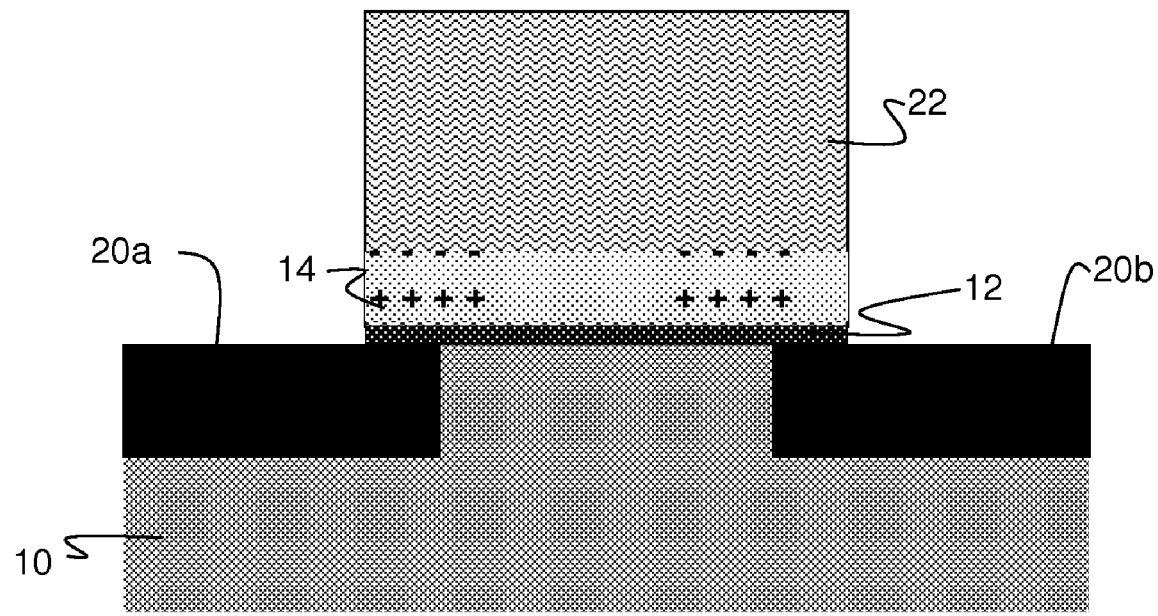

FIG. 3 shows a final structure and respective processing steps in accordance with the invention. In particular, FIG. 3 shows a symmetrical pFET with a high charge density dielectric layer (e.g., upper dielectric layer 14) formed on a gate dielectric (lower dielectric layer 12). The high charge density dielectric layer 14 has a lower positive charge and an upper negative charge formed at edges of the device, which provides improved short channel effect (SCE) characteristics for a pFET.

More specifically, the high charge density dielectric layer 14 is formed from a thermal anneal of the selectively patterned La dopant layer 16 (which was deposited on the upper dielectric layer). This thermal annealing process results in a lower positive charge and an upper negative charge at edges of the high charge density dielectric layer 14, which correspond to the selectively patterned dopant layer 16. Advantageously, the charge does not extend into the gate dielectric 12 or the substrate 10, itself, (e.g., the gate dielectric 12 acts as a spacer between the high charge density dielectric layer 14 and the substrate 10), thus preventing deleterious transport effects, i.e., scattering and reduced hole mobility in the substrate 10 known to occur in conventional devices. In this way, the high charge density dielectric layer 14 can provide for shorter Lgate, lower capacitance, higher performance and lower power consumption (compared to a conventional device which has a charge that extends into the substrate).

Still referring to FIG. 3, in conventional processes, a gate material is deposited and patterned to form a gate stack 22. The gate material can be a metal-polysilicon multi-layer structure or an all-metal structure, depending on the particular application. In embodiments, the gate stack 22 can include spacers and sidewalls, as is well known in the art. In conventional ion implantation processes, a source region 20a and drain region 20b are formed in the substrate 10. The source region 20a and drain region 20b will partially extend under (or near) the charged portion of the high charge density dielectric layer 14 (e.g., at the edges of the device). As further shown in FIG. 3, the lower dielectric layer 12 separates the source region 20a and drain region 20b from the high charge density dielectric layer 14. Also, as in all of the embodiments, the total charge content of the high charge density dielectric layer 14 is independent of the gate length and is permanently fixed.

Figure 4:
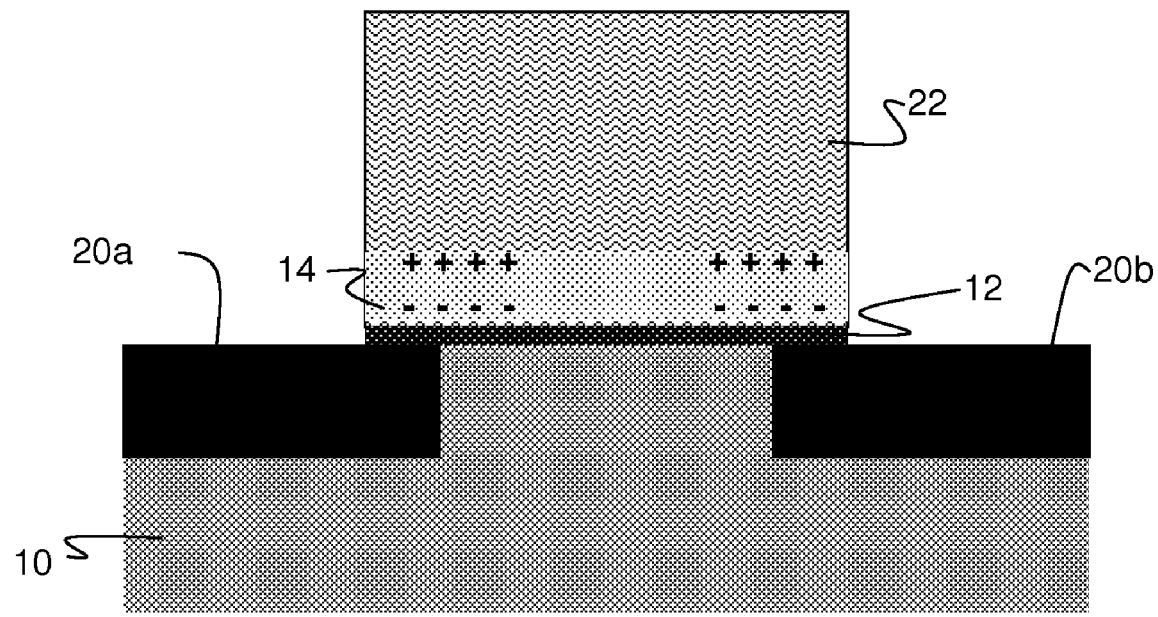
FIG. 4 shows a structure and respective processes for a symmetrical nFET in accordance with additional aspects of the invention.

FIG. 4 shows an nFET and respective processing steps in accordance with an aspect of the invention. In the embodiment of FIG. 4, the high charge density dielectric layer 14 has a lower negative charge and an upper positive charge formed at the edges of the device.

By way of processing, beginning with the structure of FIG. 2, the high charge density dielectric layer 14 is formed by thermal annealing the selectively patterned Al dopant layer 16 deposited on the upper dielectric layer. The thermal annealing process results in a high charge density dielectric layer 14 with a lower negative charge and an upper positive negative charge at edges of the device. As in the previous embodiment, advantageously, the charge at the edges of the high charge density dielectric layer 14 does not extend into the gate dielectric 12 or the substrate 10, itself. This arrangement prevents deleterious transport effects, i.e., prevents scattering and reduced electron mobility in the substrate 10. In this way, the high charge density dielectric layer 14 can provide for shorter Lgate, lower capacitance, higher performance and lower power consumption.

Still referring to FIG. 4, in conventional processes, a gate material is deposited and patterned to form a gate stack 22. As previously described, the gate material can be a metal-polysilicon multi-layer structure or an all-metal structure. Also, the gate stack 22 can include spacers and sidewalls, as is well known in the art. In conventional ion implantation processes, a source region 20a and drain region 20b are formed in the substrate 10, extending under (or near) the charged portion of the high charge density dielectric layer 14 (e.g., at the edges of the device).

Figure 5:
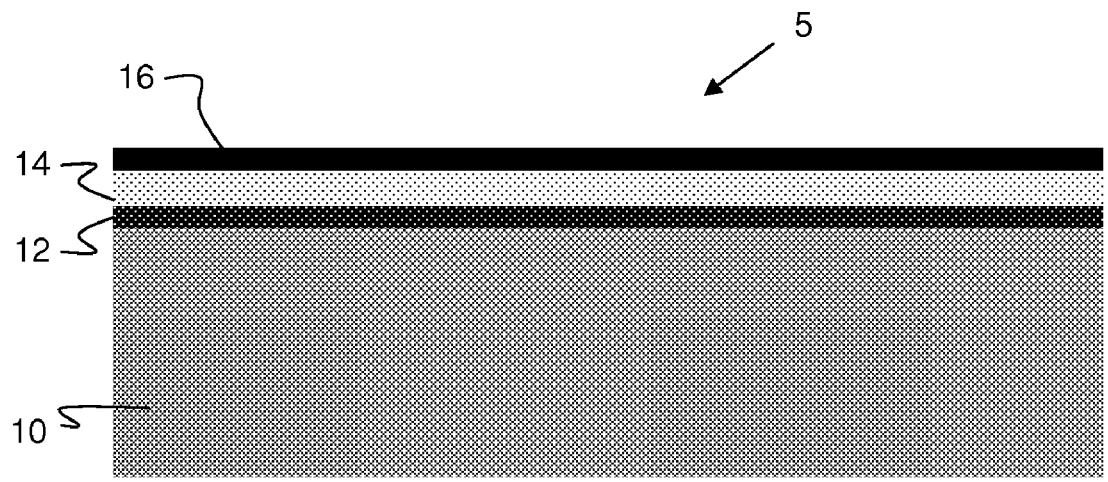
FIGS. 5-7 show structures and respective processes for a symmetrical nFET in accordance with additional aspects of the invention.

FIG. 5 shows a starting structure and respective processing steps to form a symmetrical field effect transistor (FET) in accordance with another aspect of the invention. As in the previous embodiments, the structure 5 includes a substrate 10, which can be made from any conventional substrate material such as, for example, Si, SiGe, GaAs, SOI, SiC, etc. In a two step deposition process, a lower dielectric layer 12 and an upper dielectric layer 14 are separately deposited on the substrate 10. In embodiments, the deposition processes can be, for example, chemical vapor deposition (CVD) or atomic layer deposition (ALD) processes.

In embodiments, the lower dielectric layer 12 can be silicon dioxide or oxynitride, for example. As in the previous embodiments, the lower dielectric layer 12 can range from about 5 Å to 40 Å in thickness, and more specifically in the range of about 5 Å to 30 Å and even more preferably about 5 Å to 10 Å. The upper dielectric layer 14 is a high-k dielectric material which can range in thickness from about 10 Å to about 50 Å. In embodiments, the second dielectric layer 14 can be a hafnium based material such as, for example, $HfO_x$, $HfSiN_xO_y$, or $HfTi_xO_y$.

Still referring to FIG. 5, a metal dopant layer 16 is deposited on the upper dielectric layer 14. In embodiments, the dopant layer 16 can be, for example, a compound containing Aluminum (Al) or Lanthanum (La) such as, for example, $Al_2O_3$ or $La_2O_3$ or a metal alloy such as, for example, AlTa (hereinafter referred generally to as Al or La) used for the formation of an nFET or pFET.

Figure 6:
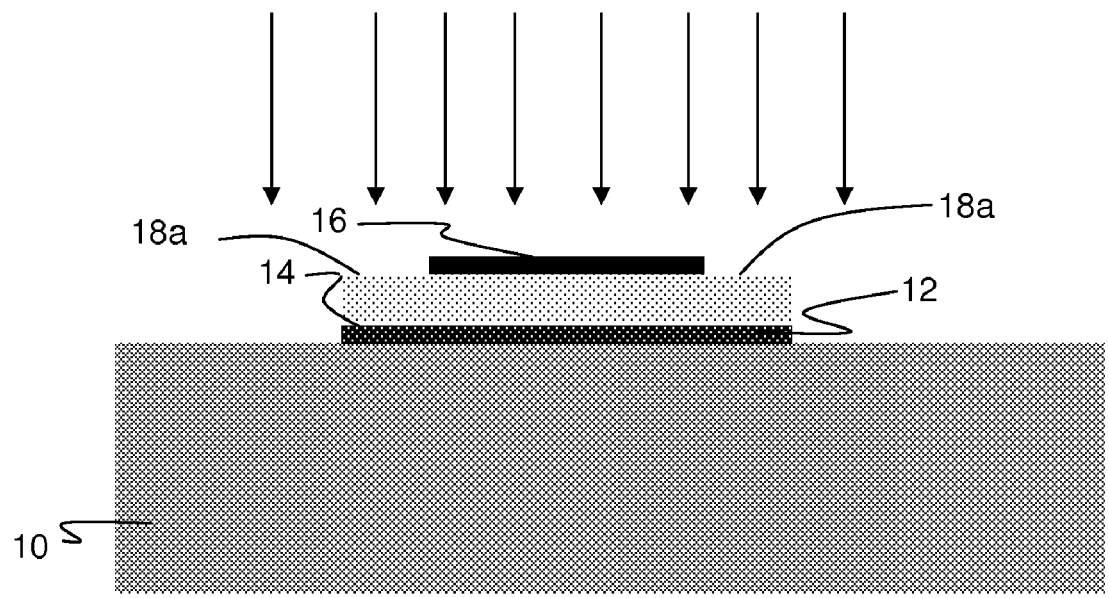

FIG. 6 shows the dopant layer 16 being patterned using conventional lithographic and etching processes. More specifically, after the initial patterning of the layers 12, 14, 16, the dopant layer 16 is patterned to form recesses 18a substantially at edges of the structure (resulting in a symmetrical structure). The structure undergoes a thermal annealing process, as represented by the arrows, at a temperature of about 800° C. to about 1100° C. As noted above, thermal annealing of Al or La will result in thermal annealing-induced electric dipoles in the second dielectric layer 14.

Figure 7:
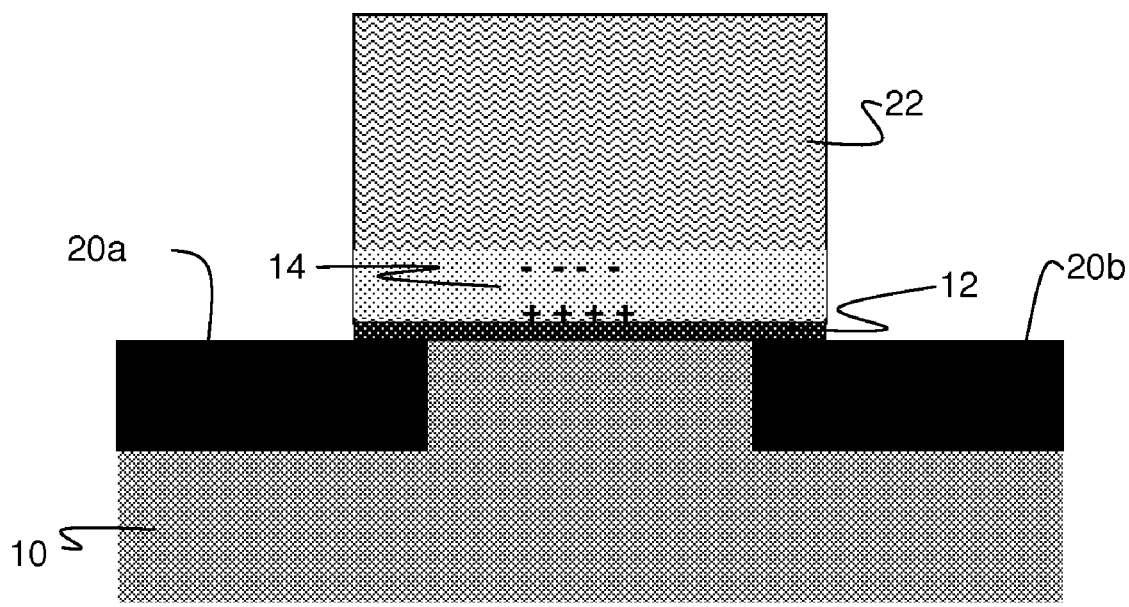

FIG. 7 shows the final structure (symmetrical nFET) with a high charge density dielectric layer (e.g., upper dielectric layer 14) formed at a center of a gate dielectric (lower dielectric layer 12). That is, the high charge density dielectric layer 14 has a lower positive charge and an upper negative charge formed at the center of the device. This structural arrangement improves short channel effect (SCE) characteristics for the nFET.

More specifically, the high charge density dielectric layer 14 is formed from a thermal anneal of the selectively patterned La dopant layer 16. Advantageously, the charge is centrally located on the device, and does not extend into the gate dielectric 12 or the substrate 10, itself, (e.g., the gate dielectric 12 acts as a spacer between the high charge density dielectric layer 14 and the substrate 10). This structural arrangement prevents transport degradation, i.e., prevents scattering and reduced electron and hole mobilities in the substrate 10 known to occur in conventional devices. In this way, the high charge density dielectric layer 14 provides for shorter Lgate, lower capacitance, higher performance and lower power consumption of the nFET (compared to a conventional device that extends into the substrate from the boundary between the gate dielectric and substrate).

Still referring to FIG. 7, in conventional processes, a gate material is deposited and patterned to form a gate stack 22. The gate material can be a metal-polysilicon multi-layer structure or an all-metal structure, depending on the particular application. In embodiments, the gate stack 22 can include spacers and sidewalls, as is well known in the art. In conventional ion implantation processes, a source region 20a and drain region 20b are formed in the substrate 10. The source region 20a and drain region 20b are on sides of the charged portion of the high charge density dielectric layer 14.

Figure 8:
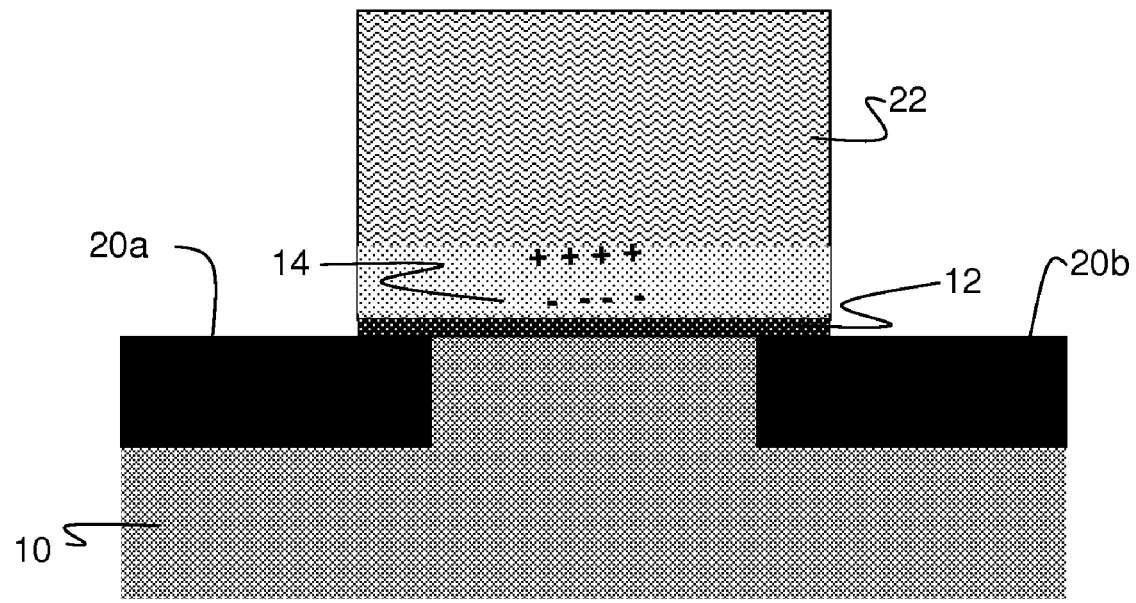
FIG. 8 shows a structure and respective processes for a symmetrical pFET in accordance with additional aspects of the invention.

FIG. 8 shows a symmetrical pFET device and respective processing steps in accordance with the invention. In particular, FIG. 8 shows a pFET with a high charge density dielectric layer 14 having a charge at a center of the gate dielectric (lower dielectric layer 12). That is, the high charge density dielectric layer 14 has a lower negative charge and an upper positive charge formed at substantially the center of the device. The structure of FIG. 8 results in improved short channel effect (SCE) characteristics for a pFET.

More specifically, beginning with the structure of FIG. 6, the high charge density dielectric layer 14 is formed from a thermal anneal of the selectively patterned Al dopant layer 16, resulting in a lower negative charge and an upper positive charge at the center of the device. As in the previous embodiments, advantageously, the charge does not extend into the gate dielectric 12 or the substrate 10, itself, thus preventing transport degradation, i.e., preventing scattering and reduced carrier mobility in the substrate 10 known to occur in conventional devices. The structural arrangement of FIG. 8 thus results in shorter Lgate, lower capacitance, higher performance and lower power consumption.

Still referring to FIG. 8, in conventional processes, a gate material is deposited and patterned to form a gate stack 22. As previously described, the gate material can be a metal-polysilicon multi-layer structure or an all-metal structure. Also, the gate stack 22 can include spacers and sidewalls, as is well known in the art. In conventional ion implantation processes, a source region 20a and drain region 20b are formed in the substrate 10, on sides of the charged portion of the high charge density dielectric layer 14.

Figure 9:
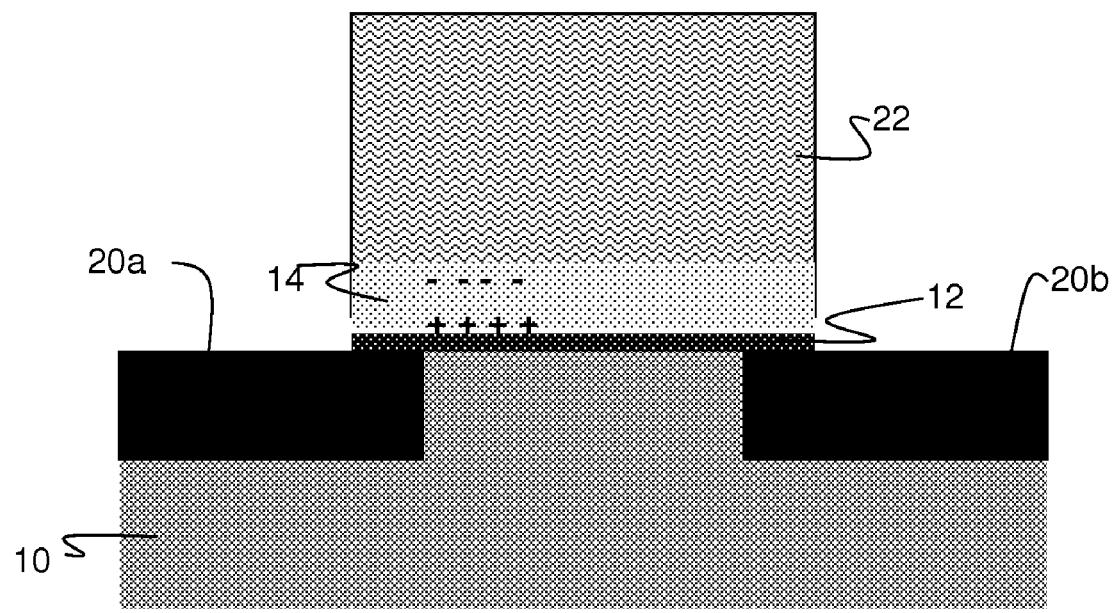
FIG. 9 shows a structure and respective processes for an asymmetrical pFET in accordance with additional aspects of the invention.

FIG. 9 shows an asymmetrical pFET and respective processing steps in accordance with aspects of the invention. In particular, as discussed with regard to the previous embodiments, a lower dielectric layer 12 and an upper dielectric layer 14 are deposited on a substrate 10. The lower dielectric layer 12 can be silicon dioxide or oxynitride, for example, and the upper dielectric layer 14 is a high-k dielectric material such as a hafnium based material, e.g., $HfO_x$, $HfSiN_xO_y$, or $HfTi_xO_y$. The dimensions of the lower dielectric layer 12 and upper dielectric layer 14 are in the ranges provided above. A metal dopant layer 16, e.g., Aluminum (Al) or Lanthanum (La) based alloy or compound, is deposited on the upper dielectric layer 14.

The metal dopant layer 16 is patterned using conventional lithographic and etching processes. By way of example, the dopant layer 16 is selectively etched to the upper dielectric layer 14 using a conventional etching process such as, for example, reactive ion etching (RIE). This etching process forms the asymmetrical pattern of FIG. 9. More specifically, in the embodiment of FIG. 9, the pattern includes the dopant layer 16 selectively remaining over a portion of the source region 20a.

The structure undergoes a thermal annealing process at a temperature of about 800° C. to about 1100° C., in embodiments. The thermal annealing of the selectively patterned La dopant layer 16 will result in thermal annealing-induced electric dipoles in the upper dielectric layer 14 (high charge density dielectric layer) as shown in FIG. 9, e.g., a lower positive charge and an upper negative charge in the upper dielectric layer 14. Advantageously, as in the previous embodiments, the charge does not extend into the gate dielectric 12 or the substrate 10, itself. In conventional processes, a gate material is deposited and patterned to form a gate stack 22 (which can include spacers and sidewalls). In conventional ion implantation processes, the source region 20a and drain region 20b are formed in the substrate 10, where the source region 20a will partially extend under (or near) the charged portion of the high charge density dielectric layer 14.

In an alternate embodiment, an asymmetrical nFET can be formed with the selectively patterned Al dopant layer 16 formed on the upper dielectric layer 14. In this embodiment, the dopant layer 16 will be patterned to form an island on the source region side of the device. After a thermal annealing process, the charged portion of the high charge density dielectric layer 14 will have a lower negative charge and an upper positive charge near the source region 20a.

Figure 10:
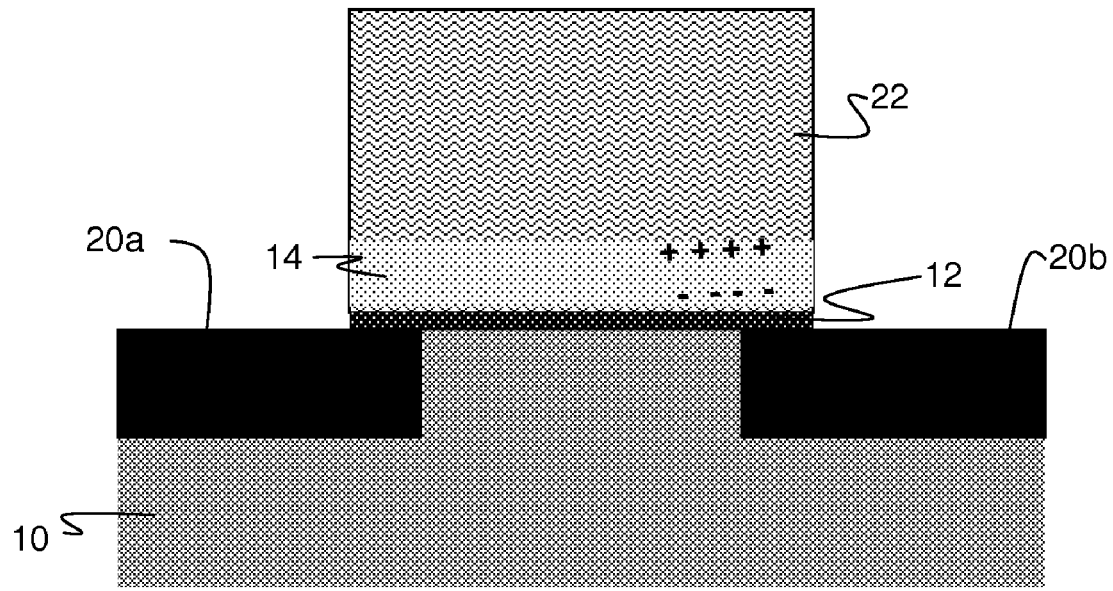
FIG. 10 shows a structure and respective processes for an asymmetrical nFET in accordance with additional aspects of the invention.

FIG. 10 shows an asymmetrical pFET and respective processing steps in accordance with aspects of the invention. In particular, as discussed with regard to the previous embodiments, a lower dielectric layer 12 and an upper dielectric layer 14 are deposited on a substrate 10. The lower dielectric layer 12 can be silicon dioxide or oxynitride, for example, and the upper dielectric layer 14 is a high-k dielectric material such as a hafnium based material, e.g., $HfO_x$, $HfSiN_xO_y$, or $HFTi_xO_y$. The dimensions of the lower dielectric layer 12 and an upper dielectric layer 14 are in the ranges provided above. A metal dopant layer 16, e.g., Aluminum (Al) or Lanthanum (La) based alloy or compound, is deposited on the upper dielectric layer 14.

The dopant layer 16 is selectively patterned using conventional lithographic and etching processes. By way of example, the dopant layer 16 is selectively etched to the upper dielectric layer 14 using a conventional etching process such as, for example, reactive ion etching (RIE). In this patterning process, the dopant layer 16 selectively remains over a portion of the drain region 20b.

The structure undergoes a thermal annealing process at a temperature of about 800° C. to about 1100° C., in embodiments. The thermal annealing of the selectively patterned Al dopant layer 16 will result in thermal annealing-induced electric dipoles in the upper dielectric layer 14 (high charge density dielectric layer) as shown in FIG. 10, e.g., a charge portion having a lower negative charge and an upper positive charge over the drain region 20b. Advantageously, as in the previous embodiments, the charge does not extend into the gate dielectric 12 or the substrate 10, itself. In conventional processes, a gate material is deposited and patterned to form a gate stack 22 (which can include spacers and sidewalls). In conventional ion implantation processes, the source region 20a and drain region 20b are formed in the substrate 10, where the drain region 20b will partially extend under (or near) the charged portion of the high charge density dielectric layer 14.

In an alternate embodiment, an asymmetrical nFET can be formed by selectively patterning an La metal dopant layer 16. In this embodiment, the dopant layer 16 will be patterned to form an island on the drain region side of the device, e.g., the pattern includes the dopant layer 16 selectively remaining over a portion of the drain region 20a. In this embodiment, the charged portion of the high charge density dielectric layer 14 will have a lower positive charge and an upper negative charge near the drain region 20b.

In each of the embodiments discussed herein, a thin gate electrode can be deposited on the upper dielectric layer 14, with the dopant layer 16 being deposited over the thin gate electrode. After patterning of the dopant layer 16, the thermal annealing process can be performed on the structure. In the thermal annealing process, the dopant will diffuse through the thin gate electrode forming the high charge density dielectric layer 14 of any of the final structures discussed above.

Figure 11:
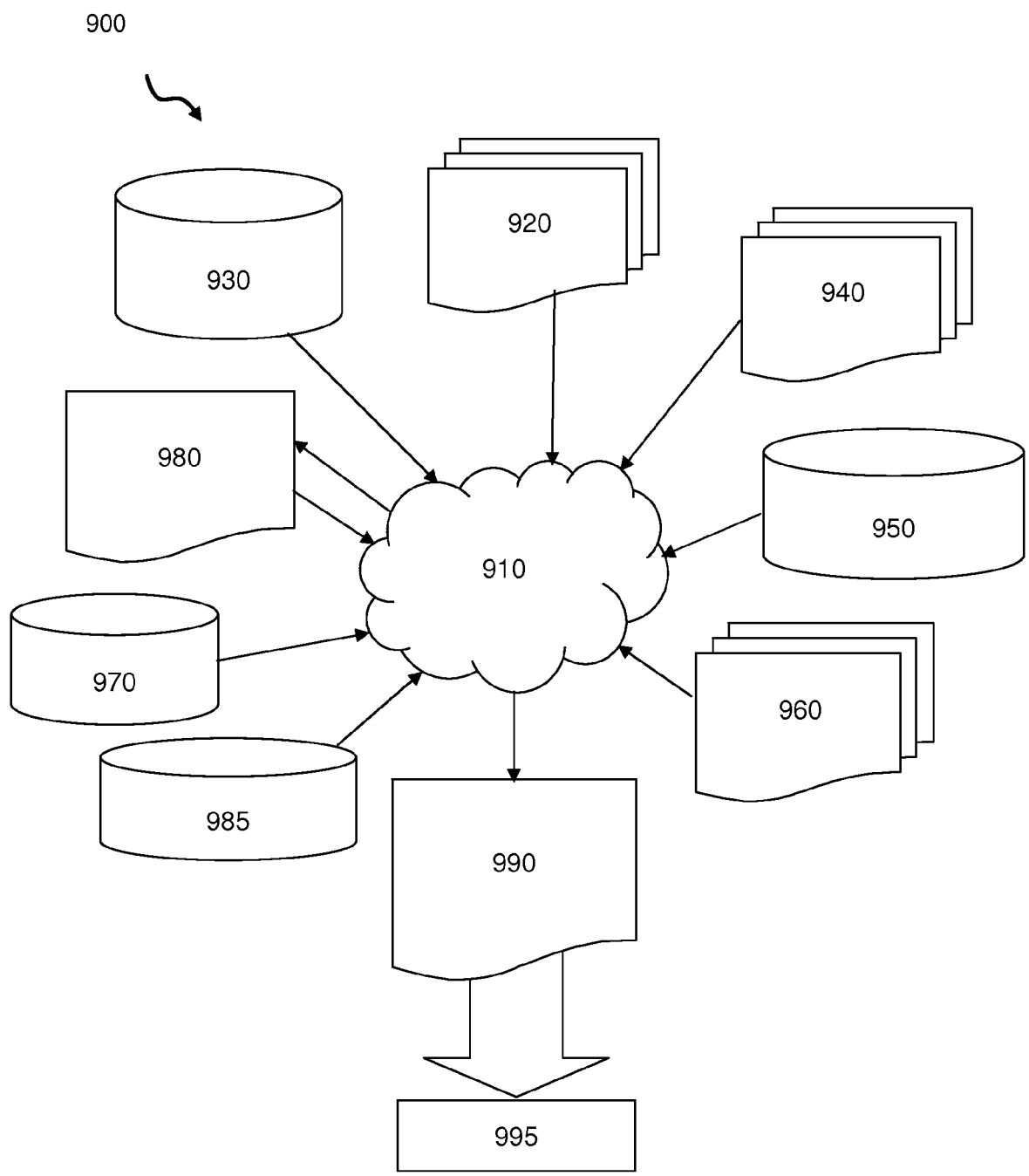
FIG. 11 is a flow diagram of a design process used in semiconductor design, manufacture, and/or test.

FIG. 11 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-10, for example. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-10, for example. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-10, for example, to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-10, for example. In one embodiment, design structure 990 may comprise a compiled, executable HDL simulation model that functionally simulates the devices shown in FIGS. 1-10, for example.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-10, for example. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of forming a transistor comprising:
   forming a lower dielectric material on an underlying substrate;

forming a high-k dielectric material on the lower dielectric material, the lower dielectric material separating the high-k dielectric material from the underlying substrate; and thermally annealing a selectively patterned dopant material formed on the high-k dielectric material to form a high charge density dielectric layer from the high-k dielectric material, wherein the high charge density dielectric layer is formed with thermal annealing-induced electric dipoles at locations corresponding to the selectively patterned dopant material.

2. The method of claim 1, wherein the high-k dielectric material is formed on the lower dielectric material, and the high-k dielectric is a hafnium based material.

3. The method of claim 1, wherein the selectively patterned dopant material is Aluminum (Al) or Lanthanum (La) based alloy or compound deposited directly on the high-k dielectric material.

4. The method of claim 1, wherein:
the selectively patterned dopant material is Aluminum (Al) or Lanthanum (La) based alloy or compound deposited on a gate electrode, which is deposited on the high-k dielectric material; and
the selectively patterned dopant material diffuses through the gate electrode to the upper dielectric layer during the thermal annealing.

5. The method of claim 1, wherein:
the high charge density dielectric layer is formed to have a charge at both edges thereof or a center thereof to form a symmetrical device; and
the charge is separated from the underlying substrate by a deposited intervening layer of the lower dielectric material which is different from the high-k dielectric material.

6. The method of claim 5, wherein the charge is one of:
a lower negative charge and an upper positive charge at the center for a pFET;
a lower positive charge and an upper negative charge at the center for an nFET;
a lower negative charge and an upper positive charge at the edges for the nFET; and
a lower positive charge and an upper negative charge at the edges for the pFET.

7. The method of claim 1, wherein:
the high charge density dielectric layer is formed to have a charge near a source region or drain region thereby forming an asymmetrical structure; and
the charge is separated from an underlying substrate by a deposited intervening layer of the lower dielectric material, different from the high-k dielectric material.

8. The method of claim 1, wherein the high charge density dielectric layer has a charge that is independent of gate length, is permanently fixed in place, and is separated from a substrate by a lower dielectric layer comprising the lower dielectric material, which is formed between the underlying substrate and the high-k dielectric material.

9. The method of claim 1, wherein the lower dielectric material has a dielectric constant that is smaller than the high-k dielectric material.

10. The method of claim 9, wherein the lower dielectric material is silicon dioxide or oxynitride.

11. The method of claim 9, wherein the lower dielectric material and the high-k dielectric material are formed in a two step deposition process, and patterned together.

12. A method of forming a transistor comprising:
forming a lower dielectric layer on a substrate;
forming an upper dielectric layer on the lower dielectric layer;
depositing a dopant material above the upper dielectric layer;
selectively patterning the dopant material; and
thermally annealing the dopant material to form a high charge density dielectric layer with electric dipoles, the electric dipoles being separated from the substrate by the lower dielectric material.

13. The method of claim 12, wherein the upper dielectric layer is a high-k dielectric material, which is different from the lower dielectric layer.

14. The method of claim 12, wherein the dopant material is deposited directly on the upper dielectric layer.

15. The method of claim 12, wherein:
the dopant material is deposited on a gate electrode, which is deposited on the upper dielectric layer; and
the dopant material diffuses through the gate electrode to the upper dielectric layer during the thermal annealing.

16. The method of claim 12, wherein the high charge density dielectric layer is formed from the upper dielectric layer and has a charge at both edges thereof or a center thereof, thereby forming a symmetrical device.

17. The method of claim 12, wherein the electric dipoles are thermal annealing-induced electric dipoles corresponding to locations of the selectively patterned dopant material.

18. The method of claim 12, wherein the high charge density dielectric layer has a charge near a source region or drain region thereby forming an asymmetrical transistor.

19. The method of claim 12, wherein the high charge density dielectric layer has a charge that is independent of gate length and is permanently fixed in place.

20. The method of claim 12, wherein the selectively patterned dopant material is Aluminum (Al) or Lanthanum (La) based alloy or compound deposited directly on the high-k dielectric material or a gate electrode deposited on the high-k dielectric material.

* * * * *